United States Patent
Lee et al.

(10) Patent No.: US 12,094,709 B2
(45) Date of Patent: Sep. 17, 2024

(54) PLASMA TREATMENT PROCESS TO DENSIFY OXIDE LAYERS

(71) Applicant: Applied Materials, Inc., Santa Clara, CA (US)

(72) Inventors: Jung Chan Lee, San Jose, CA (US); Mun Kyu Park, San Jose, CA (US); Jun Lee, Andover, MA (US); Euhngi Lee, Santa Clara, CA (US); Kyu-Ha Shim, Gloucester, MA (US); Deven Matthew Raj Mittal, Santa Clara, CA (US); Sungho Jo, Chestnut Hill, MA (US); Timothy Miller, Santa Clara, CA (US); Jingmei Liang, San Jose, CA (US); Praket Prakash Jha, San Jose, CA (US); Sanjay G. Kamath, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 514 days.

(21) Appl. No.: 17/390,151

(22) Filed: Jul. 30, 2021

(65) Prior Publication Data
US 2023/0030436 A1 Feb. 2, 2023

(51) Int. Cl.
H01L 21/02 (2006.01)
(52) U.S. Cl.
CPC .... *H01L 21/0234* (2013.01); *H01L 21/02164* (2013.01); *H01L 21/0223* (2013.01); *H01L 21/02271* (2013.01)
(58) Field of Classification Search
CPC ........... H01L 21/0234; H01L 21/02164; H01L 21/0223; H01L 21/02271; H01L 21/02326;
(Continued)

(56) References Cited

U.S. PATENT DOCUMENTS 5,270,267 A * 12/1993 Ouellet ............. H01L 21/02216
427/535
6,214,749 B1 * 4/2001 Watanabe ........... H01L 21/3121
438/782

(Continued)

OTHER PUBLICATIONS

Reinhardt, Handbook of Cleaning for Semiconductor Manufacturing (Wiley 2011) pp. 95-110 (Year: 2011).*

(Continued)

*Primary Examiner* — Calvin Y Choi
*Assistant Examiner* — Linda Joan Fleck
(74) *Attorney, Agent, or Firm* — Patterson + Sheridan, LLP (57) ABSTRACT

Embodiments of the present disclosure generally relate to methods for gap fill deposition and film densification on microelectronic devices. The method includes forming an oxide layer containing silicon oxide and having an initial wet etch rate (WER) over features disposed on the substrate, and exposing the oxide layer to a first plasma treatment to produce a treated oxide layer. The first plasma treatment includes generating a first plasma by a first RF source and directing the first plasma to the oxide layer by a DC bias. The method also includes exposing the treated oxide layer to a second plasma treatment to produce a densified oxide layer. The second plasma treatment includes generating a second plasma by top and side RF sources and directing the second plasma to the treated oxide layer without a bias. The densified oxide layer has a final WER of less than one-half of the initial WER.

20 Claims, 2 Drawing Sheets

(58) Field of Classification Search
CPC ......... H01L 21/02345; H01L 21/02222; H01L 21/02337; H01L 29/0673; H01L 29/66795; H01L 29/775; H01L 29/66439
See application file for complete search history.

(56) References Cited

U.S. PATENT DOCUMENTS

| | | | |
|---|---|---|---|
| 6,221,782 B1* | 4/2001 | Shan | H01J 37/32623 438/731 |
| 6,756,085 B2 | 6/2004 | Waldfried et al. | |
| 7,148,155 B1 | 12/2006 | Tarafdar et al. | |
| 7,935,643 B2 | 5/2011 | Liang et al. | |
| 8,101,531 B1 | 1/2012 | Li et al. | |
| 8,304,351 B2 | 11/2012 | Wang et al. | |
| 8,318,584 B2 | 11/2012 | Li et al. | |
| 8,329,587 B2 | 12/2012 | Liang et al. | |
| 8,445,078 B2 | 5/2013 | Liang et al. | |
| 8,524,612 B2 | 9/2013 | Li et al. | |
| 8,575,819 B1 | 11/2013 | Bhugra et al. | |
| 8,846,536 B2 | 9/2014 | Draeger et al. | |
| 9,299,559 B2 | 3/2016 | Draeger et al. | |
| 9,431,268 B2* | 8/2016 | Lill | C23C 16/52 |
| 9,552,978 B1* | 1/2017 | Huang | H01L 29/785 |
| 9,570,287 B2 | 2/2017 | Liang et al. | |
| 9,685,320 B2 | 6/2017 | Kang et al. | |
| 9,847,222 B2* | 12/2017 | Reilly | C23C 16/45512 |
| 9,875,888 B2* | 1/2018 | Yan | C23C 16/45551 |
| 9,941,445 B2 | 4/2018 | Escoubas et al. | |
| 10,041,167 B2 | 8/2018 | Liang et al. | |
| 10,096,466 B2* | 10/2018 | Xue | H01L 21/76829 |
| 10,109,481 B2 | 10/2018 | Zhu et al. | |
| 10,157,736 B2 | 12/2018 | van Schravendijk et al. | |
| 10,566,186 B2 | 2/2020 | van Schravendijk et al. | |
| 10,707,116 B2 | 7/2020 | Liang et al. | |
| 10,763,107 B2 | 9/2020 | van Schravendijk et al. | |
| 11,152,248 B2 | 10/2021 | Liang et al. | |
| 2004/0018319 A1 | 1/2004 | Waldfried et al. | |
| 2006/0003596 A1* | 1/2006 | Fucsko | H01L 21/02164 438/758 |
| 2007/0111543 A1 | 5/2007 | Woo et al. | |
| 2007/0298585 A1 | 12/2007 | Lubomirsky et al. | |
| 2008/0115726 A1 | 5/2008 | Ingle et al. | |
| 2008/0128870 A1 | 6/2008 | Katz | |
| 2010/0330814 A1 | 12/2010 | Yokota et al. | |
| 2012/0003840 A1 | 1/2012 | Wang et al. | |
| 2012/0068242 A1 | 3/2012 | Shin et al. | |
| 2012/0077349 A1 | 3/2012 | Li et al. | |
| 2012/0112188 A1 | 5/2012 | Yokoyama | |
| 2012/0135212 A1 | 5/2012 | Chang et al. | |
| 2012/0149213 A1 | 6/2012 | Nittala et al. | |
| 2012/0266819 A1 | 10/2012 | Sanchez et al. | |
| 2012/0269989 A1 | 10/2012 | Liang et al. | |
| 2012/0276407 A1 | 11/2012 | Chang et al. | |
| 2013/0029096 A1 | 1/2013 | Chang et al. | |
| 2013/0049064 A1 | 2/2013 | Daigo et al. | |
| 2013/0217240 A1 | 8/2013 | Mallick et al. | |
| 2013/0217241 A1 | 8/2013 | Underwood et al. | |
| 2013/0230387 A1* | 9/2013 | Silva | B64F 5/10 415/170.1 |
| 2013/0230987 A1 | 9/2013 | Draeger et al. | |
| 2013/0288485 A1 | 10/2013 | Liang et al. | |
| 2013/0319329 A1 | 12/2013 | Li et al. | |
| 2014/0011013 A1 | 1/2014 | Jin et al. | |
| 2014/0017904 A1 | 1/2014 | Gauri et al. | |
| 2014/0030830 A1 | 1/2014 | Lee et al. | |
| 2014/0134812 A1 | 5/2014 | Kim et al. | |
| 2014/0302690 A1 | 10/2014 | Underwood et al. | |
| 2014/0329027 A1 | 11/2014 | Liang et al. | |
| 2015/0044882 A1 | 2/2015 | Draeger et al. | |
| 2015/0179501 A1 | 6/2015 | Jhaveri et al. | |
| 2015/0348773 A1 | 12/2015 | Zhu et al. | |
| 2016/0020092 A1 | 1/2016 | Kang et al. | |
| 2016/0126089 A1 | 5/2016 | Liang et al. | |
| 2016/0194758 A1 | 7/2016 | Nemani et al. | |
| 2016/0240681 A1* | 8/2016 | Ching | H01L 29/42376 |
| 2016/0244879 A1 | 8/2016 | Liang et al. | |
| 2017/0194430 A1 | 7/2017 | Wood et al. | |
| 2017/0323785 A1 | 11/2017 | Singhal et al. | |
| 2017/0323803 A1 | 11/2017 | van Schravendijk et al. | |
| 2018/0330980 A1 | 11/2018 | Liang et al. | |
| 2019/0157078 A1 | 5/2019 | van Schravendijk et al. | |
| 2020/0152452 A1 | 5/2020 | van Schravendijk et al. | |
| 2020/0251328 A1* | 8/2020 | Zaitsu | H01L 21/0337 |
| 2020/0286773 A1 | 9/2020 | Liang et al. | |
| 2020/0312652 A1* | 10/2020 | Kang | H01L 21/0234 |

OTHER PUBLICATIONS

Provine et al., "Correlation of film density and wet etch rate in hydrofluoric acid of plasma enhancedatomic layer deposited silicon nitride" AIP Advances 6, 065012 (2016), 9 pages.

International Search Report and Written Opinion dated Nov. 7, 2022 for Application No. PCT/US2022/036882.

* cited by examiner

PLASMA TREATMENT PROCESS TO DENSIFY OXIDE LAYERS

BACKGROUND

Field

Embodiments of the present disclosure generally relate to fabrication of microelectronic devices, and more specifically, relate to gap fill deposition and film densification during the fabrication of microelectronic devices.

Description of the Related Art

Semiconductor device geometries have dramatically decreased in size since their introduction several decades ago. Modern semiconductor fabrication equipment routinely produce devices with feature sizes of 10 nm and sub-10 nm, and new equipment is being developed and implemented to make devices with even smaller geometries. The decreasing feature sizes result in structural features on the device having decreased spatial dimensions. The widths of gaps and trenches on the device narrow to a point where the aspect ratio of gap depth to its width becomes high enough to make it challenging to fill the gap with dielectric material. The depositing dielectric material is prone to clog at the top before the gap completely fills, producing a void or seam in the middle of the gap.

Over the years, many techniques have been developed to avoid having dielectric material clog the top of a gap, or to "heal" the void or seam that has been formed. One approach has been to start with highly flowable precursor materials that may be applied in a liquid phase to a spinning substrate surface (e.g., SOG deposition techniques). These flowable precursors can flow into and fill very small substrate gaps without forming voids or weak seams. However, once these highly flowable materials are deposited, they have to be hardened into a solid dielectric material.

In many instances, the hardening includes a heat treatment to remove components from the deposited material to leave behind a solid dielectric material, such as silicon oxide. Some of these components were necessary to make the initially deposited film flowable. Departing components increase the density of the hardened dielectric material. The hardening dielectric material tends to shrink in volume, which can leave cracks and spaces at the interlace of the dielectric material and the surrounding substrate.

Spin-on dielectrics (SOD) have also been used to flow into features on a patterned substrate. Oxygen from the environment displaces other atoms to produce a silicon oxide layer. High temperature exposure to oxygen environments can ruin underlying layers for some circuit architectures. This consideration results in the need to stay within a "thermal budget" during a manufacturing process flow. Thermal budget considerations have largely limited SOD to process flows incorporating an underlying silicon nitride layer which can protect underlying features from oxidation (e.g., DRAM applications). Alternative methods have been developed which deposit silicon-nitrogen layers by radical-component chemical vapor deposition (CVD). Radical-component CVD can produce a silicon-nitrogen layer by exciting and combining one precursor with an unexcited silicon-containing precursor in the plasma-free substrate processing region.

One example of a microelectronic device which uses a dielectric layer and has gained a lot of interest to fabricate is the gate all around (GAA) transistor. The desired properties of the GAA transistors include improved direct current (DC) performance and short channel controllability over previous transistors. However, if heated for too long and/or at too great of a temperature, the Si/SiGe layers within the GAA transistor are susceptible to oxidation and film damage, as well as dopant diffusion, and intermixing of neighboring layers (e.g., between Si-layers and SiGe-layers). Such undesired results lead to at least shallow trench isolation (STI) field loss at downstream integration, if not complete device failure.

Therefore, there is a need for a method to perform gap fill deposition and film densification during the fabrication of microelectronic devices, such as GAA transistors.

SUMMARY

Embodiments of the present disclosure generally relate to methods for processing substrates during the fabrication of microelectronic devices, where the methods include gap fill deposition and film densification. A gate all around (GAA) transistor is one exemplary type of microelectronic device which can be fabricated with the methods described and discussed herein.

In one or more embodiments, a method for processing a substrate is provided and includes forming an oxide layer containing silicon oxide and having an initial wet etch rate (WER) over features disposed on the substrate, and exposing the oxide layer to a first plasma treatment to produce a treated oxide layer while maintaining the substrate at a first temperature of less than 600° C. The first plasma treatment includes generating a first plasma by a first RF source and directing the first plasma to the oxide layer by a DC bias. The method also includes exposing the treated oxide layer to a second plasma treatment to produce a densified oxide layer while maintaining the substrate at a second temperature of less than 600° C. The second plasma treatment includes generating a second plasma by a top RF source and a side RF source and directing the second plasma to the treated oxide layer without a bias. The densified oxide layer has a final WER of less than one-half of the initial WER.

In other embodiments, a method for processing a substrate is provided and includes forming an oxide layer containing silicon oxide and having an initial WER over features disposed on the substrate. In one or more examples, the oxide layer is formed by depositing a flowable film containing one or more polysilazanes on the features, curing the polysilazane to produce a solidified film containing silicon, nitrogen, and hydrogen, and converting the solidified film to the oxide layer containing silicon oxide during an oxidation process. The method also includes exposing the oxide layer to a first plasma treatment to produce a treated oxide layer. The first plasma treatment includes generating a first plasma by a first RF source and directing the first plasma to the oxide layer by a DC bias. The method further includes exposing the treated oxide layer to a second plasma treatment to produce a densified oxide layer, where the densified oxide layer has a final WER of less than one-half of the initial WER. The second plasma treatment includes generating a second plasma by a top RF source and a side RF source and directing the second plasma to the treated oxide layer without a bias.

In some embodiments, a method for processing a substrate is provided and includes forming an oxide layer containing silicon oxide and having an initial WER over a plurality of fins disposed on the substrate. Each of the fins contains a film stack having alternating pairs of layers, where each of the pairs of layers contains a silicon-germanium layer and a silicon layer disposed on one another. The method also includes exposing the oxide layer to a first plasma treatment to produce a treated oxide layer. The first plasma treatment includes generating a first plasma by a first RF source and directing the first plasma to the oxide layer by a DC bias. The method further includes exposing the treated oxide layer to a second plasma treatment to produce a densified oxide layer, where the densified oxide layer has a final WER of less than one-half of the initial WER. The second plasma treatment includes generating a second plasma by a top RF source and a side RF source and directing the second plasma to the treated oxide layer without a bias.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and the disclosure may admit to other equally effective embodiments.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Embodiments of the present disclosure generally relate to methods for processing substrates during the fabrication of microelectronic devices, where the methods include gap fill deposition and film densification. The methods for gap fill deposition and film densification can be applied to the fabrication of semiconductor devices (e.g., transistors, capacitors, and the like), memory devices (e.g., NAND, DRAM, and the like), display devices (e.g., LCD, LED, and the like), solar and photovoltaic devices, as well as other electronic and microelectronic devices. In one or more examples, a gate all around (GAA) transistor can be fabricated with the methods described and discussed herein.

Figure 1:
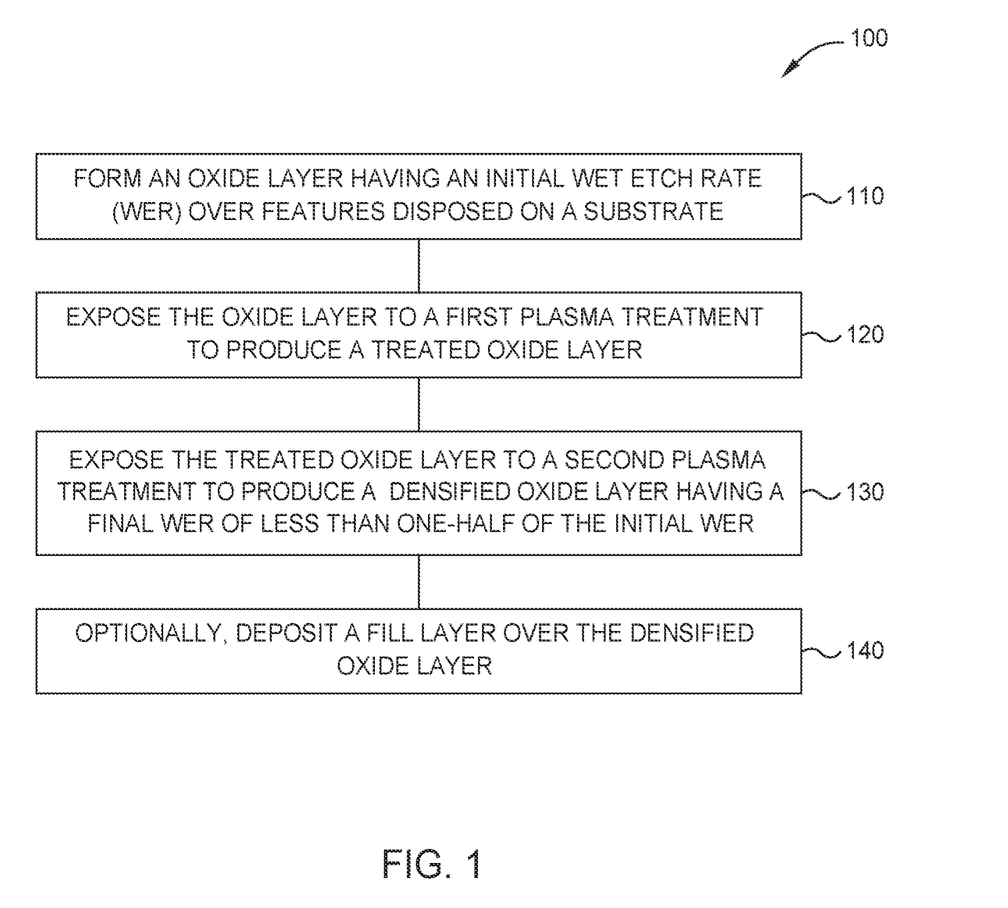
FIG. 1 is a flow chart of an exemplary method for processing a substrate which includes gap fill deposition and film densification during the fabrication of a microelectronic device, according to one or more embodiments described and discussed herein.

FIG. 1 is a flow chart of a method 100 for processing a substrate having features during the fabrication of a microelectronic device, according to one or more embodiments described and discussed herein. The method 100 includes gap fill deposition and film densification processes. The method 100 can include operations 110-140 as follows: forming or depositing an oxide layer containing silicon oxide over features on the substrate (110); exposing the oxide layer to a first plasma treatment to produce a treated oxide layer (120); exposing the treated oxide layer to a second plasma treatment to produce a densified oxide layer (130); and optionally forming or depositing a fill layer on or over the densified oxide layer (140).

At operation 110 of the method 100, an oxide layer is deposited, produced, or otherwise formed on and over the features on the substrate. The features can be or include multiple or a plurality of fins, columns, film stacks, layers, films, or other structures disposed on the substrate. For example, the features can be or include a plurality of fins. In one or more examples, each fin contains a film stack. The film stack can include alternating pairs of layers disposed on one another. In one or more examples, each of the pairs of layers contains silicon-germanium layers and silicon layers. Each of the silicon-germanium layers and silicon layers can independently be deposited or formed by an epitaxial growth process or an atomic layer deposition (ALD) process.

In one or more embodiments, the features can be or include a plurality of silicon-germanium/silicon (SiGe/Si) fin structures or a plurality of germanium/silicon (Ge/Si) fin structures. In some examples, each of the SiGe layers, the Si layers, or the Ge layers has a thickness of about 5 nm, about 8 nm, or about 10 nm to about 12 nm, about 15 nm, about 20 nm, about 25 nm, or about 30 nm.

The oxide layer formed on and over the features contains silicon oxide. In one or more embodiments, the oxide layer is formed by a multiple step process which includes depositing a flowable film onto and over the features so to fill the gaps or spaces between the features. The flowable film enabled void and seam free gap-fill. In some examples, the flowable film contains one or more polysilazanes. The flowable film or polysilazane is cured to produce a solidified film containing silicon, nitrogen, and hydrogen. The curing of the flowable film or polysilazane can be performed by exposure to one or more types of radiation, such as ultraviolet light, infrared light, visible light, microwave energy, plasma, thermal energy (e.g., heat), or any combination thereof. In one or more examples, the flowable film or polysilazane is cured with ultraviolet light to produce a solidified film. In embodiments where the flowable film contains one or more polysilazanes, the Si—Si bonds, the Si—N bonds, and the Si—H bonds are broken to incorporate oxygen into the material while producing Si—O bonds during the curing process. The flowable film is densified as being oxidized and less flowable and is converted to the solidified film containing silicon oxide.

The solidified film is an intermediate film that contains silicon oxide and contaminants, non-oxidized silicon, and/or partially oxidized silicon. The solidified film can be converted or otherwise transformed to the oxide layer containing silicon oxide during an oxidation process and/or an annealing process. In one or more examples, the oxidation process includes exposing the solidified film to steam and/or one or more other oxidizing agents during an anneal process to produce the oxide layer containing silicon oxide. The anneal process can include heating and/or maintaining the substrate at a temperature of less than 600° C., such as about 200° C., about 250° C., about 300° C., or about 350° C. to about 400° C., about 450° C., about 480° C., about 500° C., about 520° C., about 550° C., about 580° C., or about 590° C. while exposing the solidified film on the substrate to one or more oxidizing agents to form the oxide layer containing silicon oxide. Exemplary oxidizing agent can be or include water, steam, oxygen ($O_2$), ozone, hydrogen peroxide, nitrous oxide, or any combination thereof.

The oxide layer containing silicon oxide is denser than the solidified film, but by performing the densification processes described and discussed herein, the oxide layer can be further densified to a desired density. The oxide layer containing silicon oxide has a porosity of less value compared to the porosity of the solidified film from which the oxide layer is prepared from.

The oxide layer can have an initial wet etch rate (WER) of greater than 3 Å/min, greater than 3.5 Å/min, or greater than 4 Å/min to about 4.5 Å/min, about 5 Å/min, about 6 Å/min, about 8 Å/min, about 10 Å/min, or greater. If normalized, the oxide layer has an initial wet etch rate ratio (WERR) is 1. Once the oxide layer is converted to the densified oxide layer, the WER and WERR values are reduced so that the densified oxide layer has lower WER and WERR values than the oxide layer from which the densified oxide layer was generated from. The WER values were calculated or otherwise determined during etch processes which include exposing the oxide layer to 1:100 HF:water (volumetric) at about 25° C. for about 2 hours.

The oxide layer can have a thickness of about 20 nm, about 35 nm, about 50 nm, about 80 nm, or about 100 nm to about 120 nm, about 150 nm, about 200 nm, about 250 nm, about 300 nm, about 350 nm, about 400 nm, about 500 nm, about 600 nm, about 800 nm, or 1,000 nm. For example, the oxide layer can have a thickness of about 20 nm to about 1,000 nm, about 50 nm to about 1,000 nm, about 50 nm to about 800 nm, about 50 nm to about 600 nm, about 50 nm to about 500 nm, about 50 nm to about 400 nm, about 50 nm to about 300 nm, about 50 nm to about 200 nm, about 50 nm to about 100 nm, about 80 nm to about 1,000 nm, about 80 nm to about 800 nm, about 80 nm to about 600 nm, about 80 nm to about 500 nm, about 80 nm to about 400 nm, about 80 nm to about 300 nm, about 80 nm to about 200 nm, about 80 nm to about 100 nm, about 100 nm to about 1,000 nm, about 100 nm to about 800 nm, about 100 nm to about 600 nm, about 100 nm to about 500 nm, about 100 nm to about 400 nm, about 100 nm to about 300 nm, about 100 nm to about 250 nm, or about 100 nm to about 200 nm.

At operation 120 of the method 100, the oxide layer is exposed to a first plasma during a first plasma treatment to produce a treated oxide layer. The first plasma treatment includes generating the first plasma by a first RF source and exposing the oxide layer to the first plasma to produce the treated oxide layer. A direct current (DC) bias can be used to direct the first and/or accelerating ions of the first plasma to the oxide layer. The DC bias can be generated from one or more electrodes below the substrate, such as within or part of the substrate support. In one or more examples, the first plasma is an inductively coupled plasma (ICP). The first plasma is ignited or otherwise formed from a process gas containing argon, helium, neon, xenon, nitrogen ($N_2$), hydrogen ($H_2$), oxygen ($O_2$), ozone, or any combination thereof. The first plasma process can be conducted in a plasma chamber or system, such as the Varian VIISTA® PLAD™ plasma system, commercially available from Applied Materials, Inc.

The first RF source can have a power of about 0.1 kW, about 0.5 kW, about 0.8 kW, or about 1 kW to about 1.2 kW, about 1.5 kW, about 1.8 kW, about 2 kW, about 2.2 kW, about 2.5 kW, about 2.8 kW, or about 3 kW to generate the first plasma during the first plasma treatment. In some examples, the first RF source can have a power of about 3 kW or less than 3 kW. For example, the first RF source can have a power of about 0.1 kW to about 3 kW, about 0.1 kW to about 2.5 kW, about 0.1 kW to about 2 kW, about 0.1 kW to about 1.5 kW, about 0.1 kW to about 1 kW, about 0.1 kW to about 0.5 kW, about 1 kW to about 3 kW, about 1 kW to about 2.5 kW, about 1 kW to about 2 kW, about 1 kW to about 1.5 kW, about 1 kW to about 1 kW, about 1 kW to about 0.5 kW, about 1.5 kW to about 3 kW, about 1.5 kW to about 2.5 kW, about 1.5 kW to about 2 kW, or about 1.5 kW to about 1.8 kW during the first plasma treatment.

The DC bias can have a voltage of about 0.1 kV, about 0.5 kV, about 0.8 kV, about 1 kV, about 1.5 kV, or about 2 kV to about 2.5 kV, about 3 kV, about 3.5 kV, about 4 kV, about 5 kV, about 6 kV, about 7 kV, about 8 kV, about 9 kV, or about 10 kV during the first plasma treatment. For example, the DC bias can have a voltage of about 0.1 kV to about 10 kV, about 0.1 kV to about 8 kV, about 0.1 kV to about 7 kV, about 0.1 kV to about 6 kV, about 0.1 kV to about 5 kV, about 0.1 kV to about 4 kV, about 0.1 kV to about 2 kV, about 0.1 kV to about 1 kV, about 0.1 kV to about 0.5 kV, about 1 kV to about 10 kV, about 1 kV to about 8 kV, about 1 kV to about 7 kV, about 1 kV to about 6 kV, about 1 kV to about 5 kV, about 1 kV to about 4 kV, about 3 kV to about 10 kV, about 3 kV to about 8 kV, about 3 kV to about 7 kV, about 3 kV to about 6 kV, or about 3 kV to about 5 kV during the first plasma treatment.

The oxide layer is exposed to the first plasma at a dosage value of about $1\times10^{14}$ ion/cm$^2$, about $5\times10^{14}$ ion/cm$^2$, about $1\times10^{15}$ ion/cm$^2$, or about $4\times10^{15}$ ion/cm$^2$ to about $1\times10^{16}$ ion/cm$^2$, about $5\times10^{16}$ ion/cm$^2$, about $1\times10^{17}$ ion/cm$^2$, about $4\times10^{17}$ ion/cm$^2$, about $8\times10^{17}$ ion/cm$^2$, or about $1\times10^{18}$ ion/cm$^2$ during the first plasma treatment. For example, the oxide layer is exposed to the first plasma at a dosage value of about $1\times10^{14}$ ion/cm$^2$ to about $1\times10^{18}$ ion/cm$^2$, about $1\times10^{14}$ ion/cm$^2$ to about $5\times10^{17}$ ion/cm$^2$, about $1\times10^{14}$ ion/cm$^2$ to about $1\times10^{17}$ ion/cm$^2$, about $1\times10^{14}$ ion/cm$^2$ to about $5\times10^{16}$ ion/cm$^2$, about $1\times10^{14}$ ion/cm$^2$ to about $1\times10^{16}$ ion/cm$^2$, about $1\times10^{14}$ ion/cm$^2$ to about $1\times10^{15}$ ion/cm$^2$, about $1\times10^{15}$ ion/cm$^2$ to about $1\times10^{18}$ ion/cm$^2$, about $1\times10^{15}$ ion/cm$^2$ to about $5\times10^{17}$ ion/cm$^2$, about $1\times10^{15}$ ion/cm$^2$ to about $1\times10^{17}$ ion/cm$^2$, about $1\times10^{15}$ ion/cm$^2$ to about $5\times10^{16}$ ion/cm$^2$, or about $1\times10^{15}$ ion/cm$^2$ to about $1\times10^{16}$ ion/cm$^2$ during the first plasma treatment.

The substrate containing the oxide layer is heated or maintained at a first temperature during the first plasma treatment process. The first temperature is typically maintained at less than 600° C. so the features (e.g., fins) are not damaged during the first plasma treatment. The first temperature can be about 150° C., about 200° C., about 250° C., about 300° C., or about 350° C. to about 400° C., about 450° C., about 475° C., about 480° C., about 490° C., about 500° C., about 520° C., about 550° C., about 580° C., or about 590° C. For example, the first temperature can be about 150° C. to less than 600° C., about 200° C. to less than 600° C., about 250° C. to less than 600° C., about 300° C. to less than 600° C., about 350° C. to less than 600° C., about 400° C. to less than 600° C., about 450° C. to less than 600° C., about 500° C. to less than 600° C., about 550° C. to less than 600° C., about 300° C. to about 590° C., about 300° C. to about 575° C., about 300° C. to about 550° C., about 300° C. to about 525° C., about 300° C. to about 500° C., about 300° C. to about 450° C., about 250° C. to about 550° C., about 300° C. to about 550° C., about 350° C. to about 550° C., about 400° C. to about 550° C., about 450° C. to about 550° C., about 500° C. to about 550° C., about 250° C. to about 500° C., about 300° C. to about 500° C., about 350° C. to about 500° C., about 400° C. to about 500° C., about 450° C. to about 500° C., or about 475° C. to about 500° C.

At operation 130 of the method 100, the treated oxide layer is exposed to a second plasma during a second plasma treatment to produce a densified oxide layer. The densified oxide layer has a porosity of less value compared to the porosity of the treated oxide layer from which the densified oxide layer is prepared from. The second plasma is ignited, generated, or otherwise produced by at least two, three, or more plasma sources (e.g., a top RF source and a side RF source) during the second plasma treatment. The second plasma is directed to the treated oxide layer without a bias to produce the densified oxide layer. In one or more examples, the top RF source is positioned or otherwise located above the substrate and the side RF source is positioned or otherwise located adjacent or besides the substrate. In one or more examples, the second plasma is an ICP. The second plasma can also be a high-density plasma (HDP). The second plasma is ignited or otherwise formed from a process gas containing hydrogen ($H_2$), oxygen ($O_2$), ozone, nitrogen ($N_2$), argon, helium, neon, xenon, or any combination thereof. The second plasma process can be conducted in a plasma chamber or system, such as the CENTURA ULTIMA® HDP-CVD plasma chamber or system, and/or the PRODUCER® PECVD chamber or system, commercially available from Applied Materials, Inc.

Each of the top RF source and the side RF source can independently have a power of about 0.5 kW, about 0.8 kW, about 1 kW, about 1.5 kW, about 2 kW, about 2.5 kW, about 3 kW, about 3.5 kW, about 4 kW, about 4.5 kW or about 5 kW to about 5.5 kW, about 6 kW, about 6.5 kW, about 7 kW, about 7.5 kW, about 8 kW, about 8.5 kW, about 8.8 kW, about 9 kW, about 10 kW, or greater to generate the second plasma during the second plasma treatment. In some examples, each of the top RF source and the side RF source can independently have a power of about 5 kW or greater than 5 kW. For example, each of the top RF source and the side RF source can independently have a power of about 0.5 kW to about 9 kW, about 1 kW to about 9 kW, about 1 kW to about 8.5 kW, about 1 kW to about 8 kW, about 1 kW to about 7.5 kW, about 1 kW to about 7 kW, about 1 kW to about 6.5 kW, about 1 kW to about 6 kW, about 1 kW to about 5 kW, about 1 kW to about 4 kW, about 1 kW to about 3 kW, about 3 kW to about 9 kW, about 3 kW to about 8.5 kW, about 3 kW to about 8 kW, about 3 kW to about 7.5 kW, about 3 kW to about 7 kW, about 3 kW to about 6.5 kW, about 3 kW to about 6 kW, about 3 kW to about 5 kW, about 5 kW to about 9 kW, about 5 kW to about 8.5 kW, about 5 kW to about 8 kW, about 5 kW to about 7.5 kW, about 5 kW to about 7 kW, about 5 kW to about 6.5 kW, or about 5 kW to about 6 kW during the second plasma treatment.

The substrate containing the treated oxide layer is heated or maintained at a second temperature during the second plasma treatment process. The second temperature is typically maintained at less than 600° C. so the features (e.g., fins) are not damaged during the second plasma treatment. The second temperature can be about 150° C., about 200° C., about 250° C., about 300° C., or about 350° C. to about 400° C., about 450° C., about 475° C., about 480° C., about 490° C., about 500° C., about 520° C., about 550° C., about 580° C., or about 590° C. For example, the second temperature can be about 150° C. to less than 600° C., about 200° C. to less than 600° C., about 250° C. to less than 600° C., about 300° C. to less than 600° C., about 350° C. to less than 600° C., about 400° C. to less than 600° C., about 450° C. to less than 600° C., about 500° C. to less than 600° C., about 550° C. to less than 600° C., about 300° C. to about 590° C., about 300° C. to about 575° C., about 300° C. to about 550° C., about 300° C. to about 525° C., about 300° C. to about 500° C., about 300° C. to about 450° C., about 250° C. to about 550° C., about 300° C. to about 550° C., about 350° C. to about 550° C., about 400° C. to about 550° C., about 450° C. to about 550° C., about 500° C. to about 550° C., about 250° C. to about 500° C., about 300° C. to about 500° C., about 350° C. to about 500° C., about 400° C. to about 500° C., about 450° C. to about 500° C., or about 475° C. to about 500° C.

The densified oxide layer has a WER (e.g., the final WER) which is less than the WER of the oxide layer (e.g., the initial WER) from which the densified oxide layer was generated from due to the exposures to the first and second plasma treatments. Similarly, by normalizing the wet etch rate ratio (e.g., the initial WERR) of the oxide layer to 1, then the WERR of the densified oxide layer (e.g., the final WERR) is less than 1.

In one or more embodiments, the final WER of the densified oxide layer is less than 2 Å/min, such as about 1.8 Å/min, as about 1.6 Å/min, about 1.5 Å/min, about 1.4 Å/min, about 1.2 Å/min, about 1 Å/min, about 0.8 Å/min, about 0.5 Å/min, about 0.3 Å/min, about 0.2 Å/min, about 0.1 Å/min, or less.

The final WER of the densified oxide layer is less than one-half of the initial WER of the oxide layer. In some examples, the final WER of the densified oxide layer can be about 0.45, about 0.4, about 0.35, about 0.32, about 0.3, about 0.28, about 0.25, about 0.22, about 0.2, about 0.18, about 0.15, about 0.12, about 0.1, or less than the initial WER of the oxide layer. These ratios are also considered the final WERR of the densified oxide layer. For example, the oxide layer has the initial WERR and the densified oxide layer has a final WERR of less than one-half of the initial WERR. The initial WERR of the oxide layer is 1 and the final WERR of the densified oxide layer is less than 0.5, such as about 0.05, about 0.08, about 0.1, about 0.12, about 0.15, or about 0.18 to about 0.2, about 0.22, about 0.25, about 0.28, about 0.3, about 0.32, about 0.35, about 0.38, about 0.4, about 0.42, about 0.45, about 0.46, about 0.48, or about 0.49. In one or more examples, the final WERR of the densified oxide layer is about 0.05 to about 0.48, about 0.1 to about 0.48, about 0.2 to about 0.48, about 0.25 to about 0.48, about 0.3 to about 0.48, about 0.33 to about 0.48, about 0.35 to about 0.48, about 0.38 to about 0.48, about 0.4 to about 0.48, about 0.05 to about 0.4, about 0.1 to about 0.4, about 0.2 to about 0.4, about 0.25 to about 0.4, about 0.25 to about 0.45, about 0.3 to about 0.4, about 0.33 to about 0.4, about 0.35 to about 0.4, about 0.38 to about 0.4, about 0.05 to about 0.35, about 0.1 to about 0.35, about 0.2 to about 0.35, about 0.25 to about 0.35, about 0.3 to about 0.35, about 0.33 to about 0.35, about 0.32 to about 0.38, about 0.32 to about 0.35, about 0.35 to about 0.38.

The densified oxide layer can have a thickness of about 20 nm, about 35 nm, about 50 nm, about 80 nm, or about 100 nm to about 120 nm, about 150 nm, about 200 nm, about 250 nm, about 300 nm, about 350 nm, about 400 nm, about 500 nm, about 600 nm, about 800 nm, or 1,000 nm. For example, the densified oxide layer can have a thickness of about 20 nm to about 1,000 nm, about 50 nm to about 1,000 nm, about 50 nm to about 800 nm, about 50 nm to about 600 nm, about 50 nm to about 500 nm, about 50 nm to about 400 nm, about 50 nm to about 300 nm, about 50 nm to about 200 nm, about 50 nm to about 100 nm, about 80 nm to about 1,000 nm, about 80 nm to about 800 nm, about 80 nm to about 600 nm, about 80 nm to about 500 nm, about 80 nm to about 400 nm, about 80 nm to about 300 nm, about 80 nm to about 200 nm, about 80 nm to about 100 nm, about 100 nm to about 1,000 nm, about 100 nm to about 800 nm, about 100 nm to about 600 nm, about 100 nm to about 500 nm, about 100 nm to about 400 nm, about 100 nm to about 300 nm, about 100 nm to about 250 nm, or about 100 nm to about 200 nm.

At operation 140 of the method 100, one or more bulk or fill layers can optionally be deposited, produced, or otherwise formed over the densified oxide layer. The bulk or fill layer can be or contain one or more materials, such as silicon, silicon oxide, silicon nitride, silicon oxynitride, dopants thereof, or any combination thereof. Other materials can also be deposited for the bulk or fill layer. The bulk or fill layer can be deposited by one or more deposition process including chemical vapor deposition (CVD), plasma-enhanced CVD (PE-CVD), atomic layer deposition (ALD), plasma-enhanced ALD (PE-ALD), physical vapor deposition (PVD), sputtering, epitaxy, spin-on deposition, or any combination thereof. In one or more examples, the bulk or fill layer contains silicon oxide and is deposited by a thermal CVD process.

The bulk or fill layer can have a thickness of about 5 nm, about 10 nm, about 20 nm, about 35 nm, about 50 nm, about 80 nm, or about 100 nm to about 120 nm, about 150 nm, about 200 nm, about 250 nm, about 300 nm, about 400 nm, about 500 nm, about 600 nm, or greater. For example, the bulk or fill layer can have a thickness of about 5 nm to about 600 nm, about 10 nm to about 500 nm, about 50 nm to about 500 nm, about 100 nm to about 400 nm.

Figure 2A:
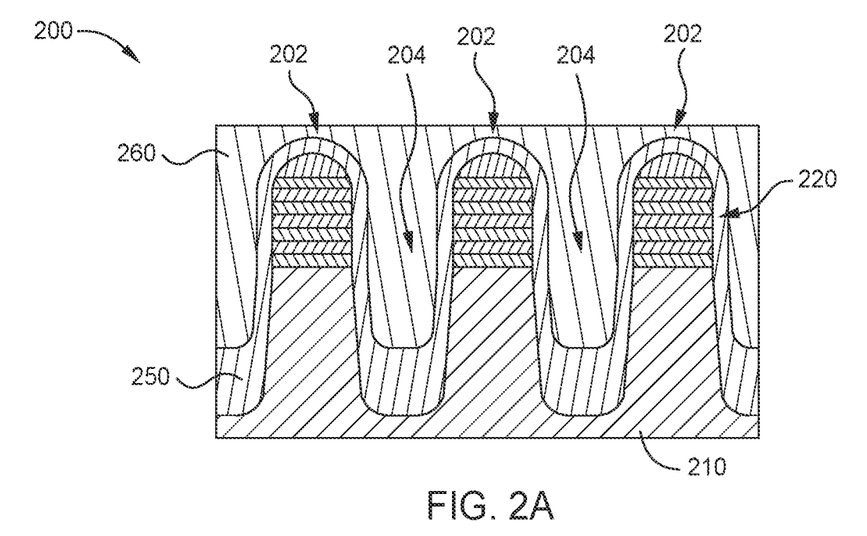
FIGS. 2A-2B depict cross-sectional views of an exemplary microelectronic device prepared by the method illustrated in the flow chart of FIG. 1, according to one or more embodiments described and discussed herein.
Figure 2B:
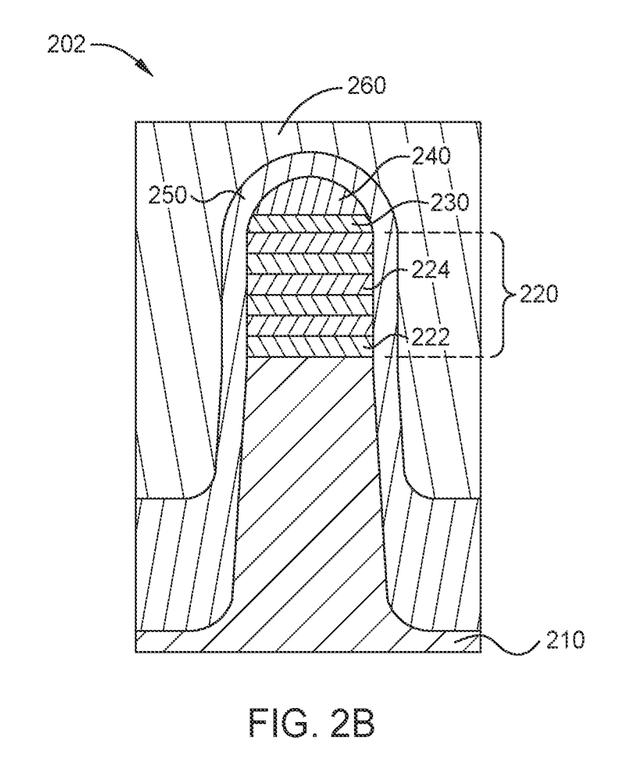

FIGS. 2A-2B depict cross-sectional views of a microelectronic device 200 which can be fabricated or otherwise prepared by the process 100, according to one or more embodiments described and discussed herein. The microelectronic device 200 can be or include one or more transistors, such as a GAA transistor.

FIG. 2A depicts the microelectronic device 200 containing a plurality of features 202 separated by spacings 204 disposed on a substrate 210. The features 202 can include a portion of the substrate 210, as shown, or alternative, be positioned or otherwise disposed on the substrate 210 (not shown). The features 202 can be or include multiple or a plurality of fins, columns, film stacks, layers, films, or other structures disposed on the substrate 210 and/or including a portion of the substrate 210. In one or more examples, each of the features 202 can be or include a fin containing a film stack 220.

The microelectronic device 200 also contains a densified oxide layer 250 disposed one and over the features 202 and a fill layer 260 disposed on and over the densified oxide layer 250. The densified oxide layer 250 can be deposited, produced, or otherwise formed by methods described and discussed herein, including process 100. In one or more examples, the densified oxide layer 250 contains silicon oxide, such as densified silicon oxide and the fill layer 260 contains silicon oxide, such as a silicon oxide deposited by vapor deposition (e.g., CVD or ALD).

FIG. 2B depicts the feature 202 containing the film stack 220, as described and discussed in one or more embodiments herein. The film stack 220 can have two, three, four, or more different types of layers or materials. As depicted in FIG. 2B, the film stack 220 contains alternating pairs of layers 222, 224 disposed on one another. In one or more examples, each of the pairs of layers 222, 224 contains silicon-germanium layers and silicon layers. In some examples, the layers 222 is or contains silicon-germanium layers and the layers 224 is or contains silicon layers. In other examples, the layers 222 is or contains silicon layers and the layers 224 is or contains silicon-germanium layers.

The film stack 220 also includes a first capping layer 230 layer disposed on the film stack 220 and a second capping layer 240 disposed on the first capping layer 230. In one or more examples, the first capping layer 230 contains silicon oxide and the second capping layer 240 contains silicon nitride.

In one or more examples, the feature 202 includes the film stack 220 containing a SiGe/Si fin structure, each SiGe layer, each Si layer, and/or each Ge layer is formed by epitaxial growth and has a thickness of about 5 nm to about 30 nm. The first capping layer 230 contains or is a silicon oxide layer deposited by CVD or ALD and has a thickness of about 2 nm to about 10 nm. The second capping layer 240 contains or is silicon nitride layer deposited by CVD or ALD and has a thickness of about 10 nm to about 50 nm. The densified oxide layer 250 contains silicon oxide deposited by flowable CVD processes described and discussed herein, densified by the densification processes (e.g., the first and second plasma treatments) described and discussed herein, and has a thickness of about 50 nm to about 500 nm. The fill layer 260 contains silicon oxide deposited by CVD and has a thickness of about 5 nm to about 600 nm.

Embodiments of the present disclosure further relate to any one or more of the following paragraphs 1-21:

1. A method for processing a substrate, comprising: forming an oxide layer comprising silicon oxide and having an initial wet etch rate (WER) over features disposed on the substrate; exposing the oxide layer to a first plasma treatment to produce a treated oxide layer while maintaining the substrate at a first temperature of less than 600° C., wherein the first plasma treatment comprises: generating a first plasma by a first RF source; and directing the first plasma to the oxide layer by a DC bias; and then exposing the treated oxide layer to a second plasma treatment to produce a densified oxide layer while maintaining the substrate at a second temperature of less than 600° C., wherein the densified oxide layer has a final WER of less than one-half of the initial WER, and wherein the second plasma treatment comprises: generating a second plasma by a top RF source and a side RF source; and directing the second plasma to the treated oxide layer without a bias.

2. A method for processing a substrate, comprising: forming an oxide layer comprising silicon oxide and having a WER over features disposed on the substrate, wherein forming the oxide layer comprises; depositing a flowable film comprising a polysilazane on the features; curing the polysilazane to produce a solidified film comprising silicon, nitrogen, and hydrogen; and converting the solidified film to the oxide layer comprising silicon oxide during an oxidation process; exposing the oxide layer to a first plasma treatment to produce a treated oxide layer, wherein the first plasma treatment comprises: generating a first plasma by a first RF source; and directing the first plasma to the oxide layer by a DC bias; and then exposing the treated oxide layer to a second plasma treatment to produce a densified oxide layer, wherein the densified oxide layer has a final WER of less than one-half of the initial WER, and wherein the second plasma treatment comprises: generating a second plasma by a top RF source and a side RF source; and directing the second plasma to the treated oxide layer without a bias.

3. A method for processing a substrate, comprising: forming an oxide layer comprising silicon oxide and having a WER over a plurality of fins disposed on the substrate, wherein each of the fins comprises a film stack containing alternating pairs of layers, wherein each of the pairs of layers contains a silicon-germanium layer and a silicon layer disposed on one another; exposing the oxide layer to a first plasma treatment to produce a treated oxide layer, wherein the first plasma treatment comprises: generating a first plasma by a first RF source; and directing the first plasma to the oxide layer by a DC bias; and then exposing the treated oxide layer to a second plasma treatment to produce a densified oxide layer, wherein the densified oxide layer has a final WER of less than one-half of the initial WER, and wherein the second plasma treatment comprises: generating a second plasma by a top RF source and a side RF source; and directing the second plasma to the treated oxide layer without a bias.

4. The method according to any one of paragraphs 1-3, wherein the initial WER is greater than 4 Å/min and the final WER is less than 2 Å/min.

5. The method according to any one of paragraphs 1-4, wherein the oxide layer comprising silicon oxide has an initial wet etch rate ratio (WERR) and the densified oxide layer has a final WERR of less than one-half of the initial WERR.

6. The method according to paragraph 5, wherein the initial wet etch rate ratio (WERR) is 1 and the final WERR is about 0.2 to about 0.48.

7. The method according to any one of paragraphs 1-6, wherein the first RF source has a power of about 0.1 kW to about 3 kW when generating the first plasma during the first plasma treatment.

8. The method according to any one of paragraphs 1-7, wherein the DC bias has a voltage of about 0.1 kV to about 10 kV during the first plasma treatment.

9. The method according to any one of paragraphs 1-8, wherein the oxide layer is exposed to the first plasma at a dosage value of about $1\times10^{14}$ ion/cm$^2$ to about $1\times10^{18}$ ion/cm$^2$ during the first plasma treatment.

10. The method according to any one of paragraphs 1-9, wherein each of the top RF source and the side RF source independently has a power of about 1 kW to about 9 kW when generating the second plasma during the second plasma treatment.

11. The method according to any one of paragraphs 1-10, wherein each of the first temperature and the second temperature is independently about 300° C. to about 575° C.

12. The method according to any one of paragraphs 1-11, wherein the densified oxide layer has a porosity of less value compared to the porosity of the treated oxide layer from which the densified oxide layer is prepared from.

13. The method according to any one of paragraphs 1-12, wherein forming the oxide layer further comprises: depositing a flowable film comprising a polysilazane on the features; curing the polysilazane to produce a solidified film comprising silicon, nitrogen, and hydrogen; and converting the solidified film to the oxide layer comprising silicon oxide during an oxidation process.

14. The method according to paragraph 13, wherein the oxidation process comprises exposing the solidified film to steam during an anneal process.

15. The method according to paragraph 14, wherein the substrate is maintained at a temperature of less than 600° C. during the anneal process.

16. The method according to paragraph 13, wherein the polysilazane is cured with ultraviolet light to produce the solidified film.

17. The method according to any one of paragraphs 1-16, further comprising depositing a fill layer over the densified oxide layer.

18. The method according to paragraph 17, wherein the fill layer comprises silicon oxide and is deposited by chemical vapor deposition.

19. The method according to any one of paragraphs 1-18, wherein the features disposed on the substrate are a plurality of fins.

20. The method according to paragraph 19, wherein each of the fins comprises a film stack containing alternating pairs of layers, 21. The method according to paragraph 20, wherein each of the pairs of layers contains a silicon-germanium layer and a silicon layer disposed on one another.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise, whenever a composition, an element, or a group of elements is preceded with the transitional phrase "comprising", it is understood that the same composition or group of elements with transitional phrases "consisting essentially of", "consisting of", "selected from the group of consisting of", or "is" preceding the recitation of the composition, element, or elements and vice versa, are contemplated. As used herein, the term "about" refers to a +/−10% variation from the nominal value. It is to be understood that such a variation can be included in any value provided herein.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method for processing a substrate, comprising:
forming an oxide layer comprising silicon oxide and having an initial wet etch rate (WER) over features disposed on the substrate, wherein the initial WER is determined with an etchant having a concentration;
exposing the oxide layer to a first plasma treatment to produce a treated oxide layer while maintaining the substrate at a first temperature of less than 600° C., wherein the first plasma treatment comprises:
generating a first plasma by a first RF source; and
directing the first plasma to the oxide layer by a DC bias; and then
exposing the treated oxide layer to a second plasma treatment to produce a densified oxide layer while maintaining the substrate at a second temperature of less than 600° C., wherein the densified oxide layer has a final WER of less than one-half of the initial WER, wherein the final WER is determined with the etchant having the concentration, wherein the oxide layer comprising silicon oxide has a normalized wet etch rate ratio (WERR) of 1 and the densified oxide layer has a final WERR of about 0.1 to about 0.48, and wherein the second plasma treatment comprises:
- generating a second plasma by a top RF source and a side RF source; and
- directing the second plasma to the treated oxide layer without a bias.

2. The method of claim 1, wherein the initial WER is greater than 4 Å/min and the final WER is less than 2 Å/min.

3. The method of claim 2, wherein the initial WER is about 5 Å/min to about 10 Å/min.

4. The method of claim 1, wherein the final WERR is about 0.1 to about 0.35.

5. The method of claim 1, wherein the first RF source has a power of about 0.1 kW to about 3 kW when generating the first plasma during the first plasma treatment.

6. The method of claim 1, wherein the DC bias has a voltage of about 0.1 kV to about 10 kV during the first plasma treatment.

7. The method of claim 1, wherein the oxide layer is exposed to the first plasma at a dosage value of about $1 \times 10^{14}$ ion/cm$^2$ to about $1 \times 10^{18}$ ion/cm$^2$ during the first plasma treatment.

8. The method of claim 1, wherein each of the top RF source and the side RF source independently has a power of about 1 kW to about 9 kW when generating the second plasma during the second plasma treatment.

9. The method of claim 1, wherein each of the first temperature and the second temperature is independently about 300° C. to about 575° C.

10. The method of claim 1, wherein the densified oxide layer has a porosity of less value compared to the porosity of the treated oxide layer from which the densified oxide layer is prepared from.

11. The method of claim 1, wherein forming the oxide layer further comprises:
- depositing a flowable film comprising a polysilazane on the features;
- curing the polysilazane to produce a solidified film comprising silicon, nitrogen, and hydrogen; and
- converting the solidified film to the oxide layer comprising silicon oxide during an oxidation process.

12. The method of claim 11, wherein the oxidation process comprises exposing the solidified film to steam during an anneal process.

13. The method of claim 12, wherein the substrate is maintained at a temperature of less than 600° C. during the anneal process.

14. The method of claim 11, wherein the polysilazane is cured with ultraviolet light to produce the solidified film.

15. The method of claim 1, further comprising depositing a fill layer over the densified oxide layer.

16. The method of claim 15, wherein the fill layer comprises silicon oxide and is deposited by chemical vapor deposition.

17. The method of claim 1, wherein the features disposed on the substrate are a plurality of fins.

18. The method of claim 17, wherein each of the fins comprises a film stack containing alternating pairs of layers, wherein each of the pairs of layers contains a silicon-germanium layer and a silicon layer disposed on one another.

19. A method for processing a substrate, comprising:
forming an oxide layer comprising silicon oxide and having an initial wet etch rate (WER) over features disposed on the substrate, wherein the initial WER is determined with an etchant having a concentration, and wherein forming the oxide layer comprises;
- depositing a flowable film comprising a polysilazane on the features;
- curing the polysilazane to produce a solidified film comprising silicon, nitrogen, and hydrogen; and
- converting the solidified film to the oxide layer comprising silicon oxide during an oxidation process;

exposing the oxide layer to a first plasma treatment to produce a treated oxide layer, wherein the first plasma treatment comprises:
- generating a first plasma by a first RF source; and
- directing the first plasma to the oxide layer by a DC bias; and then exposing the treated oxide layer to a second plasma treatment to produce a densified oxide layer, wherein the densified oxide layer has a final WER of less than one-half of the initial WER, wherein the final WER is determined with the etchant having the concentration, and wherein the oxide layer comprising silicon oxide has a normalized wet etch rate ratio (WERR) of 1 and the densified oxide layer has a final WERR of about 0.1 to about 0.4, and wherein the second plasma treatment comprises:
- generating a second plasma by a top RF source and a side RF source; and
- directing the second plasma to the treated oxide layer without a bias.

20. A method for processing a substrate, comprising:
forming an oxide layer comprising silicon oxide and having an initial wet etch rate (WER) over a plurality of fins disposed on the substrate, wherein the initial WER is determined with an etchant having a concentration, and wherein each of the fins comprises a film stack containing alternating pairs of layers, wherein each of the pairs of layers contains a silicon-germanium layer and a silicon layer disposed on one another;

exposing the oxide layer to a first plasma treatment to produce a treated oxide layer, wherein the first plasma treatment comprises:
- generating a first plasma by a first RF source; and
- directing the first plasma to the oxide layer by a DC bias; and then exposing the treated oxide layer to a second plasma treatment to produce a densified oxide layer, wherein the initial WER is greater than 4 Å/min, wherein the densified oxide layer has a final WER of less than 2 Å/min, wherein the final WER is determined with the etchant having the concentration, and wherein the second plasma treatment comprises:
- generating a second plasma by a top RF source and a side RF source; and
- directing the second plasma to the treated oxide layer without a bias, and wherein the oxide layer comprising silicon oxide has a normalized wet etch rate ratio (WERR) of 1 and the densified oxide layer has a final WERR of about 0.1 to about 0.48.

* * * * *